(12) United States Patent
Chen

(10) Patent No.: US 8,975,659 B2
(45) Date of Patent: Mar. 10, 2015

(54) CHIP ON BOARD LIGHT EMITTING DIODE DEVICE HAVING DISSIPATION UNIT ARRAY

(71) Applicant: Cofan USA, Inc., Fremont, CA (US)

(72) Inventor: Pao Chen, Milpitas, CA (US)

(73) Assignee: Cofan USA, Inc., Fremont, CA (US)

( * ) Notice: Subject to any disclaimer, the term of this patent is extended or adjusted under 35 U.S.C. 154(b) by 0 days.

(21) Appl. No.: 13/917,325

(22) Filed: Jun. 13, 2013

(65) Prior Publication Data

US 2014/0367716 A1    Dec. 18, 2014

(51) Int. Cl.
| | | |
|---|---|---|
| H01L 29/22 | (2006.01) | |
| H01L 33/00 | (2010.01) | |
| H01L 29/227 | (2006.01) | |
| H01L 33/64 | (2010.01) | |
| H01L 33/60 | (2010.01) | |

(52) U.S. Cl.
CPC .............. *H01L 33/647* (2013.01); *H01L 33/60* (2013.01)
USPC 257/99; 257/98; 257/E33.056; 257/E33.057; 257/E33.058

(58) Field of Classification Search
USPC ........ 257/98, 99, E33.056, E33.057, E33.058
See application file for complete search history.

(56) References Cited

U.S. PATENT DOCUMENTS

| | | | | |
|---|---|---|---|---|
| 6,864,571 B2 * | 3/2005 | Arik et al. | ...................... | 257/712 |
| 8,049,330 B2 * | 11/2011 | Tain et al. | ...................... | 257/720 |
| 8,067,780 B2 * | 11/2011 | Shieh et al. | ...................... | 257/99 |
| 8,633,643 B2 * | 1/2014 | Lee et al. | ...................... | 313/498 |
| 8,664,686 B2 * | 3/2014 | Shieh et al. | ...................... | 257/99 |
| 2002/0056906 A1 * | 5/2002 | Kajiwara et al. | .............. | 257/697 |
| 2002/0117330 A1 * | 8/2002 | Eldridge et al. | .............. | 174/260 |
| 2002/0117747 A1 * | 8/2002 | Dautartas et al. | ............. | 257/706 |
| 2004/0012958 A1 * | 1/2004 | Hashimoto et al. | ........... | 362/241 |
| 2004/0036134 A1 * | 2/2004 | Li | ................... | 257/432 |
| 2004/0259326 A1 * | 12/2004 | Hideo | ......................... | 438/458 |
| 2008/0143245 A1 * | 6/2008 | Shiue et al. | ................... | 313/499 |
| 2009/0045416 A1 * | 2/2009 | Bierhuizen et al. | ............. | 257/88 |
| 2009/0124031 A1 * | 5/2009 | Tung | ............................... | 438/26 |
| 2011/0049559 A1 * | 3/2011 | Yen | ................................ | 257/99 |
| 2011/0294242 A1 * | 12/2011 | Lu | ................................... | 438/27 |
| 2012/0097996 A1 * | 4/2012 | Lee et al. | ........................ | 257/88 |
| 2012/0138995 A1 * | 6/2012 | Hwang | .......................... | 257/98 |
| 2013/0133864 A1 * | 5/2013 | Yang et al. | .............. | 165/104.26 |
| 2013/0153944 A1 * | 6/2013 | Su et al. | ........................ | 257/98 |
| 2013/0306964 A1 * | 11/2013 | Han | ............................... | 257/43 |

* cited by examiner

*Primary Examiner* — Ida M Soward
(74) *Attorney, Agent, or Firm* — Alston & Bird LLP

(57) ABSTRACT

A chip on board light emitting diode (LED) device includes a LED device, a printed circuit board (PCB) and a dissipation unit array. The LED device includes a LED substrate, a first contact pad and a second contact pad above the LED substrate and a thermal layer formed on top surface of the LED device. The thermal layer includes a thermal conductive material. A printed circuit board (PCB) includes a PCB substrate with a thermal projection extending from surface of the PCB substrate, and a first and a second electrode pads above the PCB substrate. The thermal projection and the PCB substrate include the thermal conductive material. The dissipation unit array includes a plurality of dissipation units each disposed between the LED device and the PCB. The thermal layer is thermally coupled to the thermal projection via at least one dissipation unit. Each of the first and second contact pads is electrically coupled to the corresponding electrode pad via at least one dissipation unit.

19 Claims, 16 Drawing Sheets

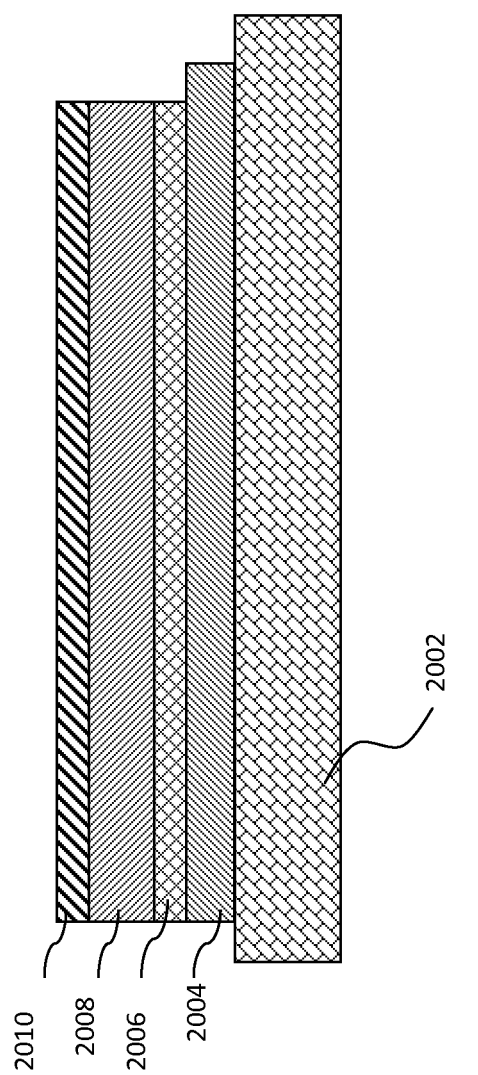

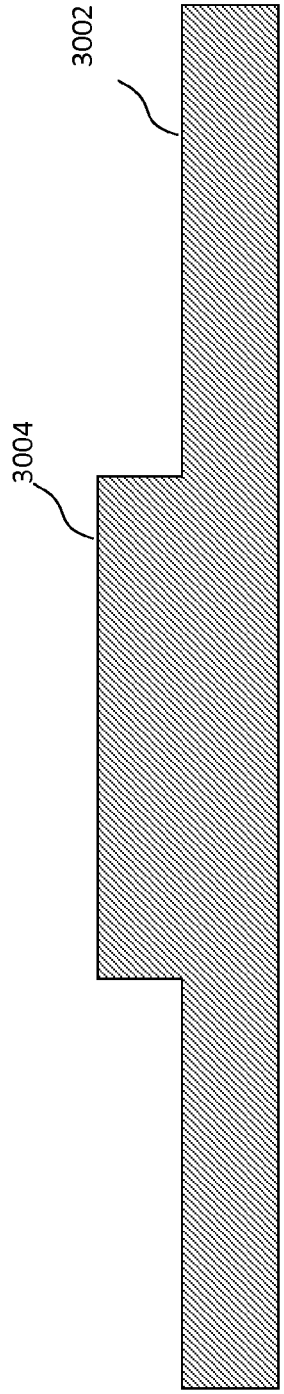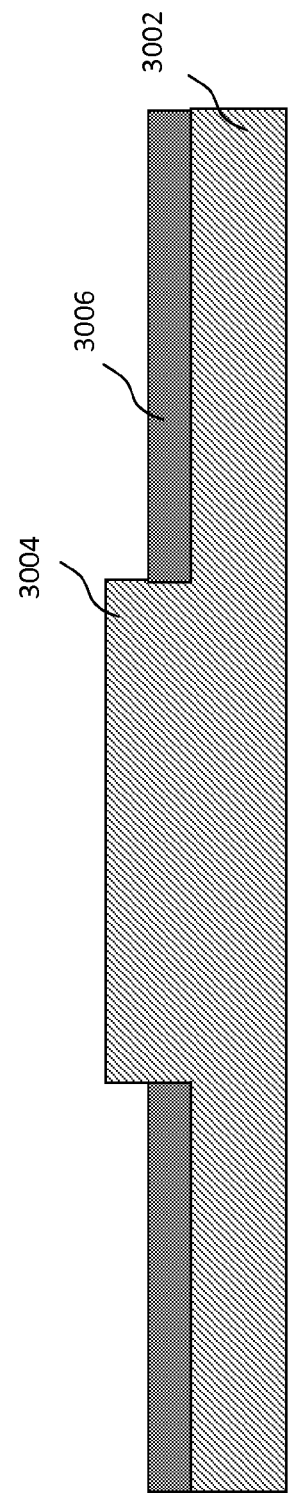
FIG. 3A
FIG. 3B

CHIP ON BOARD LIGHT EMITTING DIODE DEVICE HAVING DISSIPATION UNIT ARRAY

TECHNICAL FIELD

The example embodiments of the present invention generally relate to methods of fabricating light emitting diode devices, and more particularly to designs and fabrication processes of chip on board light emitting diode devices.

BACKGROUND

As electronic products evolve technologically, space constraints for electronics continue to be a concern for design engineers. Chip on board (COB) technology allows many light emitting diode (LED) chips to be placed in a small space offering many advantages to standard packaging. With the ability to pack more light emitting or light detection chips into an area, performance of the circuit can greatly increase. However, doing so creates problems with dissipating the heat when known approaches are used to couple the LED device to the printed circuit board (PCB). Thus insufficient thermal dissipation may result in overheating which may cause severe performance degradation or permanent damage to the COB LED. A new approach may be desired to improve heat dissipation.

BRIEF SUMMARY

According to one exemplary embodiment of the present invention, a chip on board light emitting diode (LED) device comprises a LED device, a printed circuit board (PCB) and a dissipation unit array. The LED device comprises a LED substrate, a first contact pad and a second contact pad above the LED substrate and a thermal layer formed on top surface of the LED device. The thermal layer comprises a first thermal conductive material. A printed circuit board (PCB) comprises a PCB substrate with a thermal projection projecting from surface of the PCB substrate, a first electrode pad and a second electrode pad above the PCB substrate. The dissipation unit array comprises a plurality of dissipation units each disposed between the LED device and the PCB. The thermal layer is thermally coupled to the thermal projection via at least one of the plurality of dissipation units. The first contact pad is electronically coupled to the first electrode pad via at least one dissipation unit. The second contact pad is electronically coupled to the second electrode pad via one dissipation unit.

According to one exemplary embodiment of the present invention, a method of manufacturing a chip on board LED device comprises providing a LED wafer. The LED wafer comprises an array of LED devices on the wafer surface. Each LED device comprises a LED substrate, a first contact pad and a second contact pad and a thermal layer formed on top surface of the LED structure. The method further comprises coupling a plurality of dissipation unit arrays to the LED devices. Each dissipation unit array comprises a plurality of dissipation units. The method further comprises dicing the LED wafer into a plurality of LED devices coupled with at least one dissipation unit array. The method further comprises coupling a PCB to the dissipation unit array.

BRIEF DESCRIPTION OF THE DRAWING(S)

Having thus described the example embodiments of the present invention in general terms, reference will now be made to the accompanying drawings, which are not necessarily drawn to scale, and wherein:

FIGS. 2A-2F are cross-sectional views to illustrate an example process of fabricating a LED structure according to some example embodiments;

FIGS. 3A-3C are cross-sectional views to illustrate an example process of fabricating a PCB according to some example embodiments;

DETAILED DESCRIPTION

The present disclosure now will be described more fully with reference to the accompanying drawings, in which some, but not all embodiments of the disclosure are shown. This disclosure may be embodied in many different forms and should not be construed as limited to the embodiments set forth; rather, these example embodiments are provided so that this disclosure will be thorough and complete, and will fully convey the scope of the disclosure to those skilled in the art. Like numbers refer to like elements throughout.

Figure 1A:
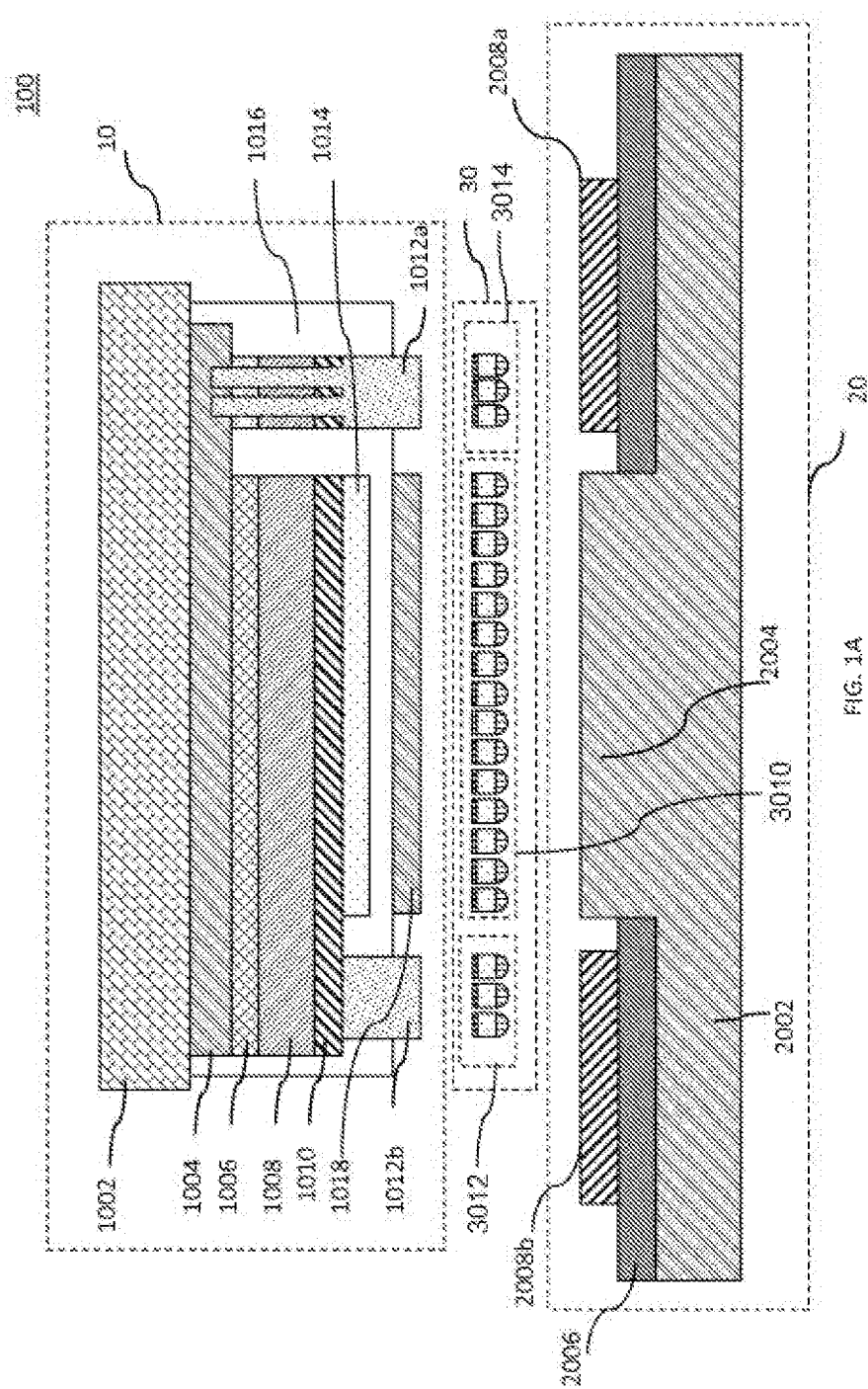
FIG. 1A illustrates a cross-sectional view of a COB LED structure according to some example embodiments of the present invention.

FIG. 1A illustrates a cross-sectional view of a COB LED structure 100 according to some example embodiments ("example," "exemplary" and like terms as used herein refer to "serving as an example, instance or illustration"). The COB LED structure 100 may comprise a LED device 10. The LED device 10 may comprise a LED substrate 1002, a first type semiconductor layer 1004 formed on the LED substrate 1002, an active layer 1006 formed on the first type semiconductor layer 1004 and a second type semiconductor layer 1008 formed on the active layer 1006. A conductive layer 1010 may be deposited on the second type semiconductor layer 1008. A first contact pad 1012a and a second contact pad 1012b may be formed on the conductive layer 1010. The LED device 10 may further comprise a reflective layer 1014 covering at least a portion of the conductive layer 1010. The LED device 10 may further comprise a passivation layer 1016 covering the underlying layers with surfaces of the first contact pad 1012a and the second contact pad 1012b uncovered. The LED device 10 may further comprise a thermal layer 1018 covering at least a portion of the passivation layer 1016 between the first contact pad 1012a and the second contact pad 1012b.

The COB LED structure 100 may further comprise a PCB 20. The PCB 20 may comprise a PCB substrate 2002 with a thermal projection 2004 projecting from surface of the PCB substrate 2002. The PCB 20 may further comprise a dielectric layer 2006. The dielectric layer 2006 covering at least a portion of the PCB substrate 2002. The PCB 20 may further comprise a conductive layer forming a first electrode pad 2008a and a second electrode pad 2008b on the dielectric layer 2006.

The COB LED structure 100 may further comprise a dissipation unit array 30. The dissipation unit array 30 may comprise groups of dissipation units, for example, groups 3010, 3012 and 3014. Each dissipation unit may comprise a dissipation base, a dissipation body formed on the dissipation base and a dissipation cap covering the dissipation body. The dissipation base may be in contact with the first contact pad 1012a, the second contact pad 1012b and the thermal layer 1018. The dissipation cap may be in contact with the electrode pads 2008a, 2008b and thermal projection 2004. The LED device, the PCB and the dissipation unit array are described in the detail below.

Figure 1B:
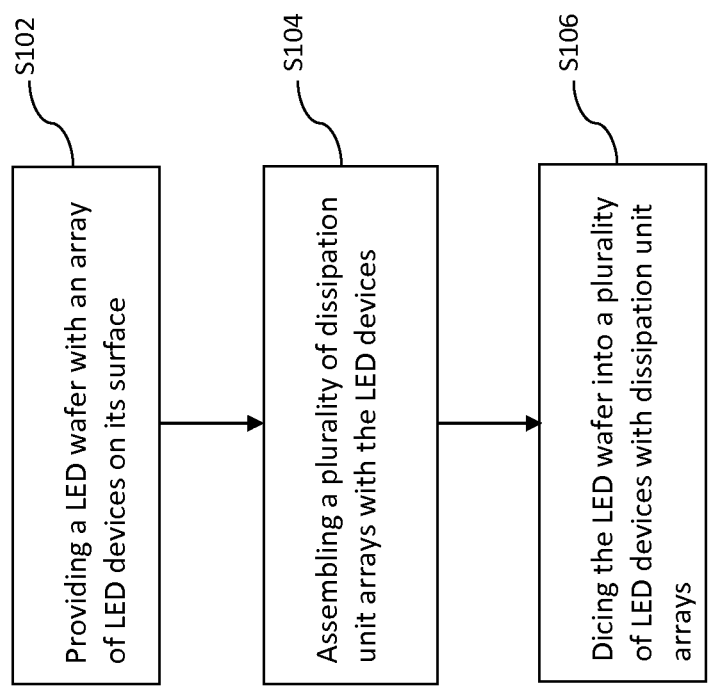
FIG. 1B is a flow chart illustrating an example process of manufacturing a COB LED structure according to some example embodiments.

An example process of assembling a COB LED structure is illustrated by FIG. 1B. The process may comprise providing a LED wafer with LED devices formed on its surface at step S102. The LED device may comprise a first contact pad and a second contact pad on top of the LED substrate. The first contact pad and the second contact pad may be separated by passivation and a thermal layer. The process may further comprise coupling a plurality of dissipation unit arrays to the LED devices at step S104. Each dissipation unit array may comprise a plurality of dissipation units. The LED wafer may be diced into a plurality of LED devices at step S106. Each LED device may be coupled with at least one dissipation unit array. A PCB may then be coupled to the LED device via the at least one dissipation unit array at step S108. The PCB may comprise a thermal projection projecting from surface of PCB substrate. The PCB may further comprise electrode pads formed on the PCB substrate. The contact pads of the LED device may be electronically coupled to the electrode pads of the PCB via at least one dissipation unit. The thermal layer may be thermally coupled to the thermal projection via at least one dissipation unit.

FIGS. 2A-2F are cross-sectional views to illustrate an example process of fabricating a LED device according to example embodiments. The method of fabricating a LED device may comprise providing a LED substrate 2002. The LED substrate 2002 may comprise sapphire, $Al_2O_3$ or any other insulating material such as SiC, GaN, ZnO, MgO, $Ga_2O_3$, AlGaN, GaLiO, AlLiO, GaAs, Si and/or the like. The method of manufacturing the LED device may further comprise forming a first type semiconductor layer 2004 on the LED substrate 2002, forming an active layer 2006 on the first type semiconductor layer 2004 and forming a second type semiconductor layer 2008 on the active layer 2006. The first type semiconductor layer 2004 and the second type semiconductor layer 2008 may include a first semiconductor material. The first semiconductor material may be doped GaN, or any other material such as InGaN, GaAs, GaP, AlGaInP, GaAsP, AlGaAs, or AlGaP. The first type semiconductor layer 2004 and the second type semiconductor layer 2008 may include different types of doping. For instance, the first type semiconductor layer 2004 may be an n-doped semiconductor layer and the second type semiconductor layer 2008 may be a p-doped semiconductor layer, or vice versa. The active layer 2006 may include a second semiconductor material that has narrower band gap than that of the first material. The second semiconductor material may include doped GaN, or any other material such as InGaN, GaAs, GaP, AlGaInP, GaAsP, AlGaAs, or AlGaP. The LED device manufacturing process may further comprise forming a conductive layer 2010 on the second type semiconductor layer 2008. The conductive layer 2010 may include one material that has translucent or transparent properties or insufficient reflective properties, such as $In_2O_3$, $SnO_2$, IMO, ZnO, IZO, ITO, Ni, Au, Ti or Ni. Each layer described above may be formed by deposition methods such as physical vapor deposition (PVD) or chemical vapor deposition (CVD).

Figure 2B:
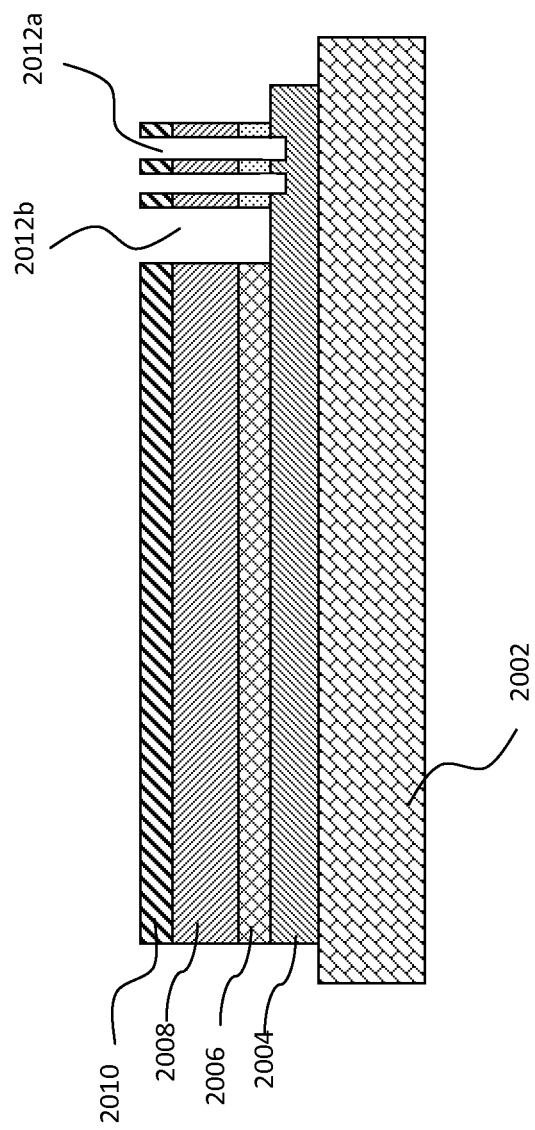

The LED device manufacturing process may further comprise applying a photolithography process and/or an etching process to form a plurality of trenches (e.g., first trenches 2012a, a second trench 2012b as shown in FIG. 2B). The trenches may extend from surface of the conductive layer 2010 to the first type semiconductor layer 2004 to expose part of the first type semiconductor layer 2004. In some examples, one or more of the first trenches 2012a and the second trenches 2012b may extend into the first type semiconductor layer 2004. Methods of fabricating the trenches, size and shape of the trenches are described in detail in commonly assigned patent application Ser. No. 13/474,656.

Figure 2C:
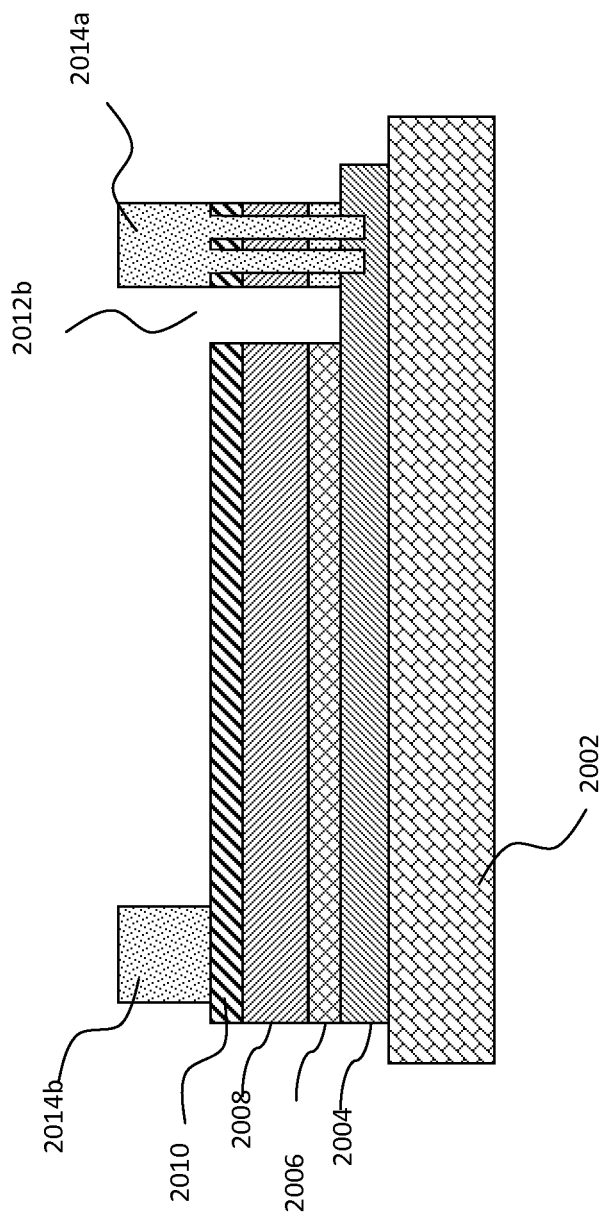
Figure 2D:
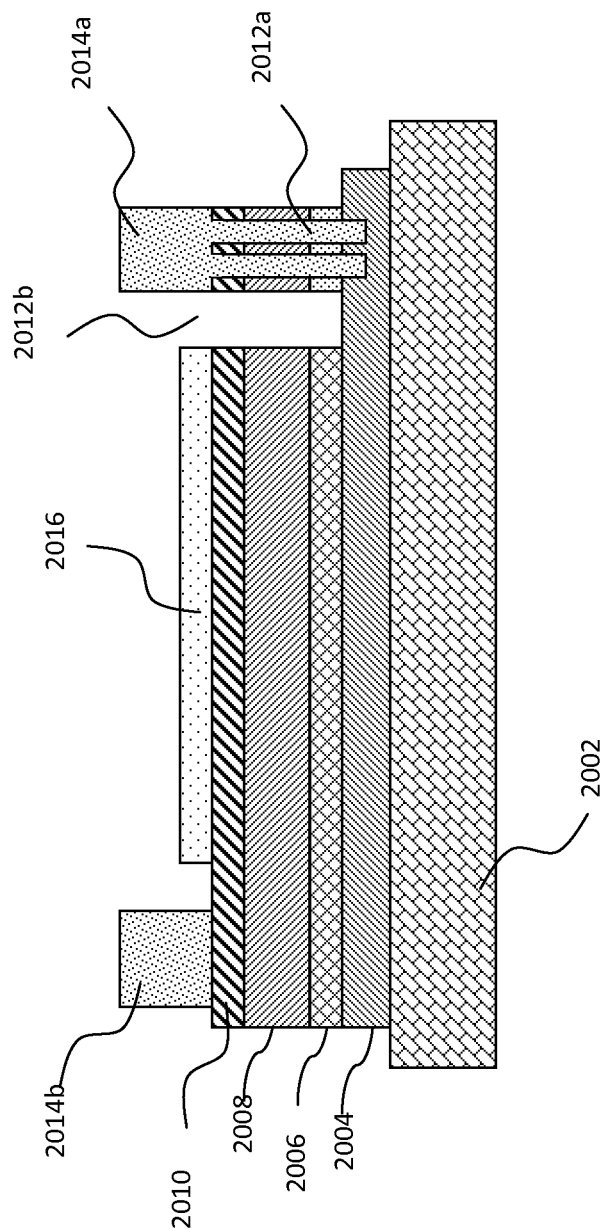
Figure 2E:
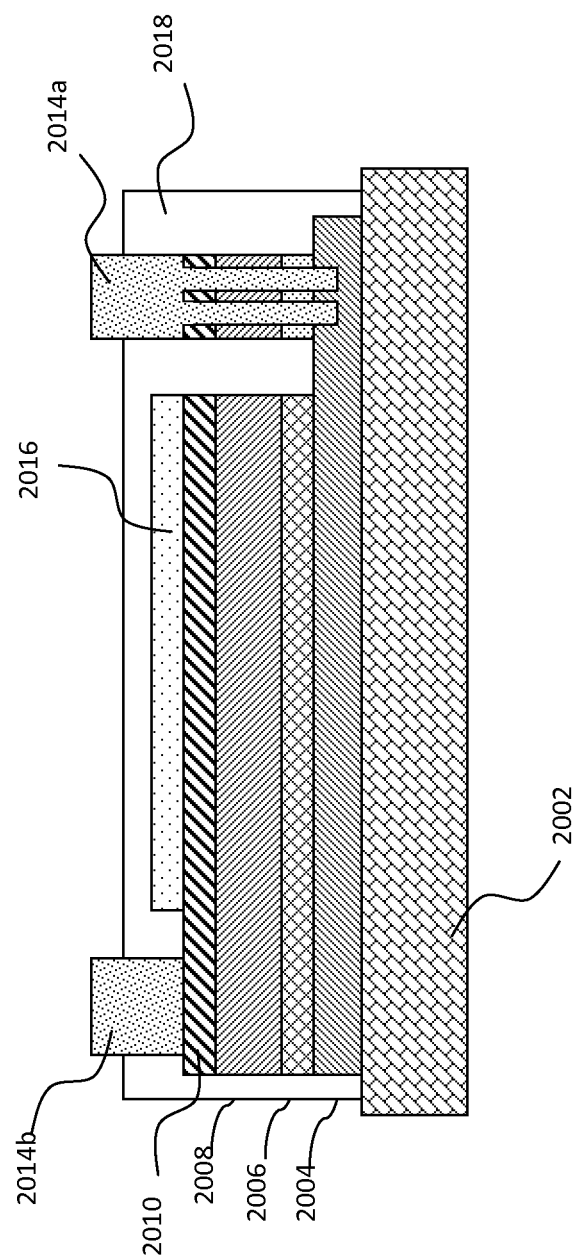

To form contact pads (e.g., first contact pad 2014a and second contact pad 2014b as shown in FIG. 2C-2E) on the LED device, a layer of conductive material may be deposited over the underlying layers. A photolithography process may subsequently be applied to remove undesired conductive material resulting in the first contact pad 2014a and the second contact pad 2014b on the conductive layer 2010, as shown in FIG. 2C. The first contact pad 2014a covers surfaces of the conductive layer 2010 between adjacent first trenches 2012a and electrically connects to the first type semiconductor layer 2004 by filling the conductive material in the first trenches 2012a. The electrical connection formed by filling the first trenches 2012a with the conductive material may extend into the first type semiconductor layer 2004. The second contact pad 2014b may cover at least a portion of the conductive layer 2010. The conductive material of the first contact pad 2014a and the second contact pad 2014b may include at least one of Ti, Ni, Au, Cr, Ag, Al, Cu and W.

A reflective layer 2016 to reflect light toward the substrate 2002 may be formed on the conductive layer 2010 to cover at least a portion of the conductive layer 2010 as shown in FIG. 2D. The reflective layer 2016 may include one or more reflective materials that have light reflection properties, such as Ag, Al, Rh, Ti, Ni, W, Mo, Cr, Pt, Pd, and/or alloy of above metals.

A passivation layer 2018 may then be formed to cover surface of the underlying layers with the first contact pad 2014a and the second contact pad 2014b uncovered, as shown in FIG. 2E. Thereafter, a photolithography process may be applied to remove undesired passivation material from surfaces of the first contact pad 2014a and the second contact pad 2014b and obtain a desired thickness of the passivation layer 2018. The passivation layer may have a surface planar to the surfaces of the first contact pad 2014a and the second contact pad 2014b. Surface of the passivation layer may also be higher or lower than surfaces of the first contact pad 2014a and the second contact pad 2014b in different embodiments. The passivation layer 2018 may include one or more materials that have dielectric property, such as $SiO_2$, $Si_3N_4$, $Al_2O_3$, AlN, TiO, $Ta_2O_5$ and/or the like.

Figure 2F:
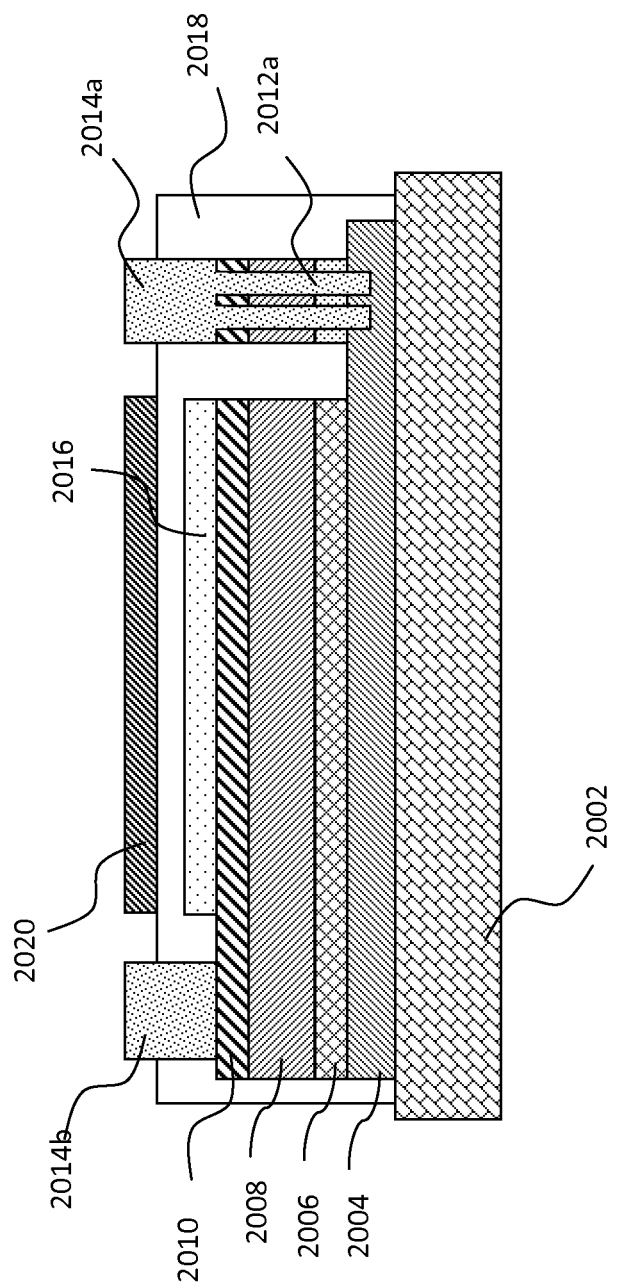

In an instance in which surface of the passivation layer 2018 is lower than surfaces of the first contact pad 2014a and the second contact pad 2014b as shown in FIG. 2E, a thermal layer 2020 may be formed on the passivation layer 2018 shown in FIG. 2F, to cover at least a portion of the passivation layer 2018 between the first contact pad 2014a and the second contact pad 2014b. The thermal layer 2020 may comprise at least one of Ti, Ni, Au, Al, Cr, Sn, Cu and Ag. A photolithography process may subsequently be applied resulting in a planar surface. Although each of the contact pads of LED devices (e.g., LED device 510 in FIG. 5C, LED device 610 in FIG. 6C and LED device 710 in FIG. 7C) described below may have a surface planar to that of the thermal layer, surface of the thermal layer may also be higher or lower than that of each contact pad depending on different embodiments.

Figure 3C:
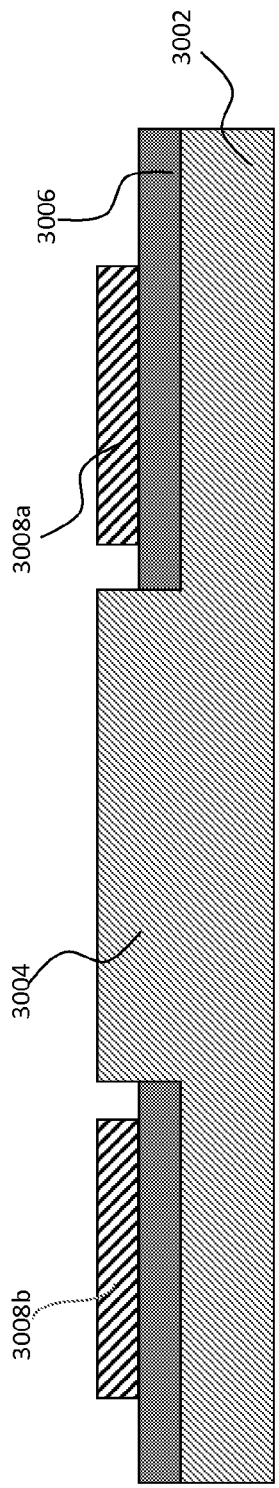

FIGS. 3A-3C are cross-sectional views to illustrate an example manufacturing process of fabricating a PCB according to some example embodiments. A method of manufacturing a PCB may comprise providing a PCB substrate 3002. A photolithography or mechanical process may be applied to obtain a thermal projection 3004 projecting from surface of the PCB substrate 3002, as shown in FIG. 3A. The PCB substrate 3002 may comprise one or more thermal conductive materials, such as but not limited to, Al, Cu, metal alloy and graphite. A dielectric layer 3006 having dielectric material may be formed on the PCB substrate 3002. Thereafter, a mechanical process may subsequently be applied to remove undesired dielectric material from surface of the PCB substrate 3002 and surface of the thermal projection 3004 such that the dielectric layer 3006 covers at least a portion of the PCB substrate 3002, as shown in FIG. 3B. The dielectric layer 3006 may comprise one or more of Pre-Preg, plastic, epoxy and polymer. A conductive layer may be formed on the dielectric layer 3006 resulting in a first electrode pad 3008a, a second electrode pad 3008b (shown in FIG. 3C) as well as circuitry (not shown). The first electrode pad 3008a and second electrode pad 3008b may be separated by the thermal projection 3004. The first electrode pad 3008a and the second electrode pad 3008b may comprise at least one of Ag, Cu, Au, Sn, Ni and Al.

The thermal projection 3004 may have a surface planar to those of the first electrode pad 3008a and the second electrode pad 3008b, as illustrated in FIG. 3C. In another embodiment, such as the embodiment shown in FIG. 6A, surface of the thermal projection 6204 may be higher than that of the first electrode pad 6208a and the second electrode pad 6208b. In the embodiment shown in FIG. 7A, surface of the thermal projection 7204 may be lower than those of the first electrode pad 7208a and the second electrode pad 7208b.

Figure 4:
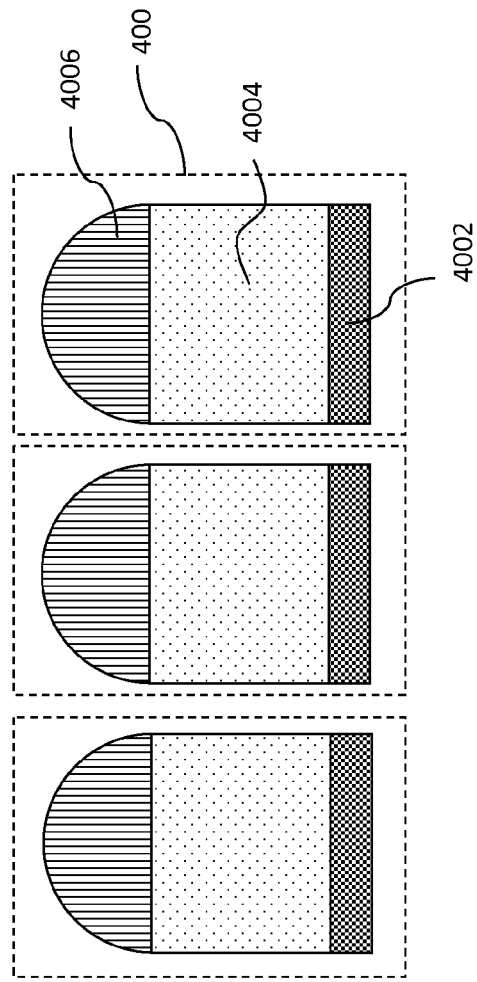
FIG. 4 illustrates a cross-sectional view of a dissipation unit array according to some example embodiments.

FIG. 4 illustrates a cross-sectional view of a dissipation unit array according to one example embodiment of the present invention. The dissipation unit array may comprise a plurality of dissipation units. Each dissipation unit, such as dissipation unit 400 may comprise a dissipation base 4002, a dissipation body 4004 formed on the dissipation base 4002 and a dissipation cap 4006 covering the dissipation body 4004. The dissipation base 4002 may comprise at least one of Ti, Al and Ni. The dissipation body 4004 may comprise at least one of Cu and Al. The dissipation cap 4006 may comprise at least one of Ni, Sn, Ag, Pb and Au. Referring back to FIG. 1, the dissipation unit array 30 may be disposed between the LED device 10 and the PCB 20 to allow the thermal layer 1018 to thermally couple to the thermal projection 2004. The dissipation unit array 30 also allows each of the first contact pad 1012a and the second contact pad 1012b to electronically couple to its associated electrode pad such as the first electrode pad 2008a and the second electrode pad 2008b. For convenience and brevity, a group of dissipation units that thermally couple the thermal layer 1018 to the thermal projection 2004 is defined as a thermal dissipation unit group. A group of dissipation units that electrically couple the electrode pads to the contact pads is defined as an electrical dissipation unit group. Each of the thermal dissipation unit group and the electrical dissipation unit group may comprise a single dissipation unit or a plurality of dissipation units.

When assembled, the dissipation base of each dissipation unit may be in contact with the first contact pad 1012a, the second contact pad 1012b and the thermal layer 1018. The dissipation cap of each dissipation unit may be in contact with the first electrode pad 2008a, the second electrode pad 2008b and the thermal projection 2004. The size and shape of each dissipation unit may be variable. The size of each dissipation unit may be determined by distance between the first contact pad 1012a and the first electrode pad 2008a, distance between the second pact pad 1012a and the second electrode pad 2008b, or distance between the thermal layer 1018 and the thermal projection 2004.

Depending on distance between the first contact pad of the LED device and the first electrode pad of the PCB, distance between the second contact pad of the LED device and the second electrode pad of the PCB, and distance between thermal layer of the LED and thermal projection of the PCB, size of each dissipation unit may be adjusted in an attempt to make contact pads of the LED device electronically couple to electrode pads of PCB and thermal layer of the LED device thermally couple to thermal projection of PCB, thereby increasing heat dissipation efficiency. Shape of each dissipation unit may be varied with surface of the LED device (e.g., surfaces of the electrode pads and the thermal layer) and surface of the PCB (e.g., surfaces of the contact pads and the thermal projection).

Figure 5A:
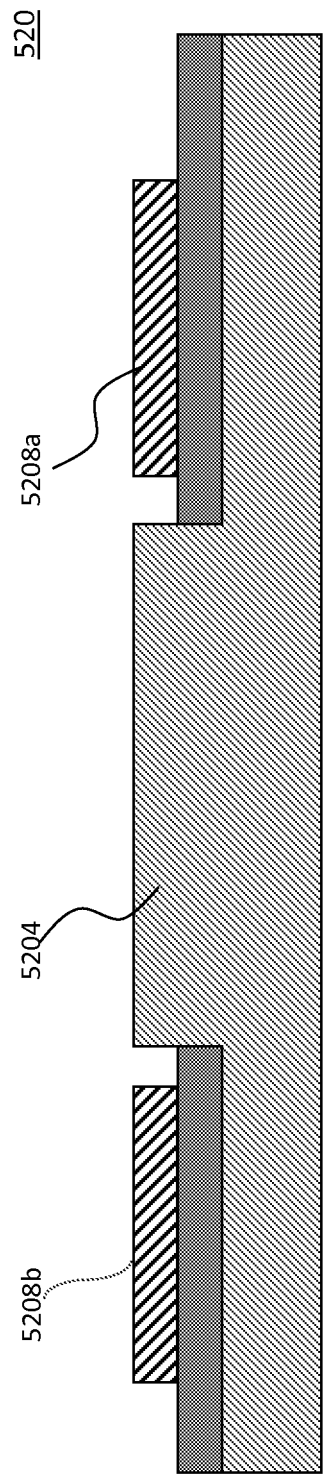
FIGS. 5A-5C, 6A-6C and 7A-7C illustrate cross-sectional views of example COB LED structures according to some example embodiments.
Figure 5B:
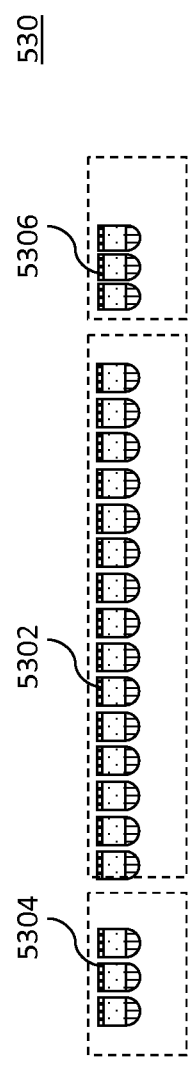
Figure 5C:
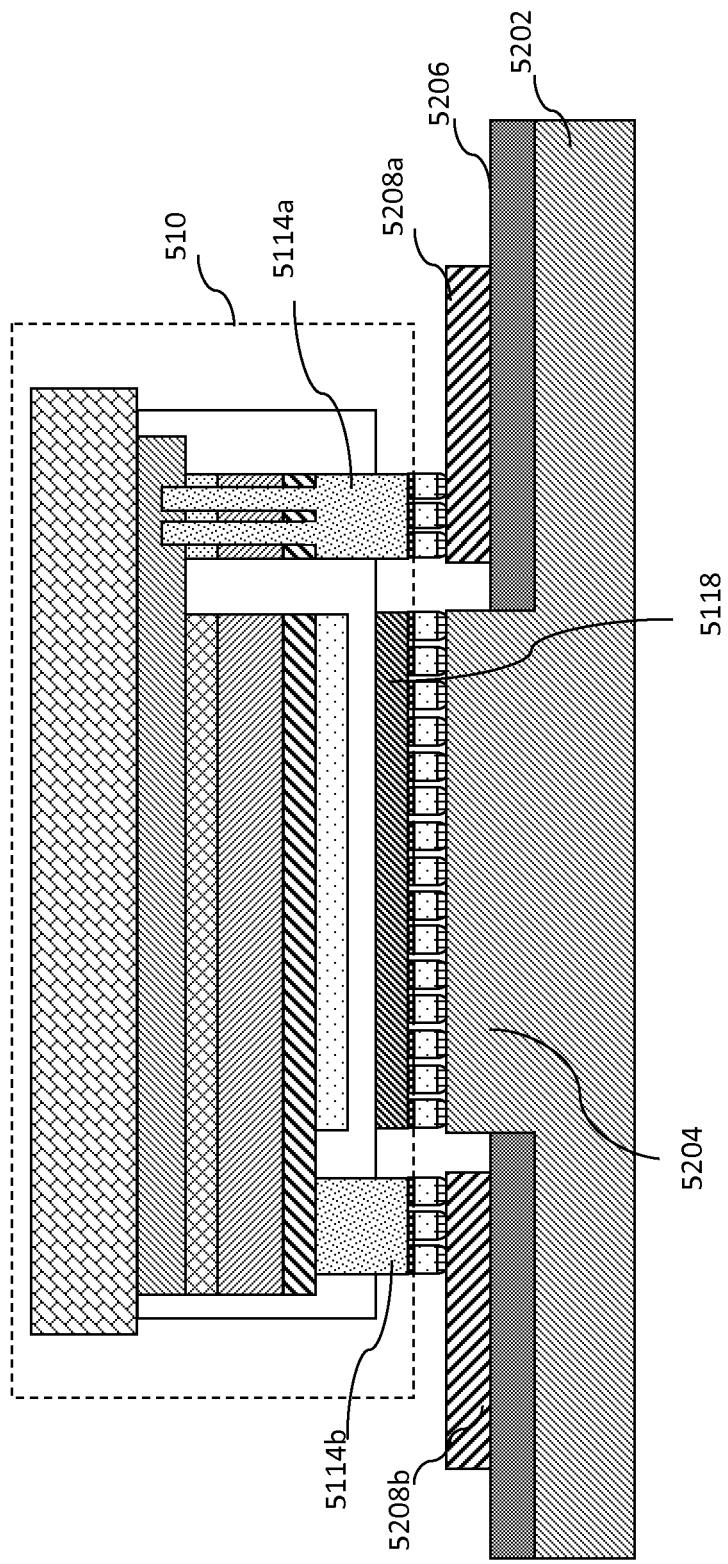

For instance, FIGS. 5A-5C illustrate cross-sectional views of a COB LED structure according to example embodiments. As shown in FIG. 5A, a thermal projection 5204 of a PCB 520 may have a surface planar to those of a first electrode pad 5208a and a second electrode pad 5208b. Thermal layer 5118 of a LED device 510 may have a surface planar to surface of a first contact pad 5114a and surface of a second contact pad 5114b. To couple the LED device 510 to the PCB 520, dissipation unit array 530 shown in FIG. 5B may be employed. In the dissipation unit array 530, dissipation units in thermal dissipation unit group 5302 may have similar size and shape as to dissipation units in electrical dissipation unit groups 5304 and 5306.

Figure 6A:
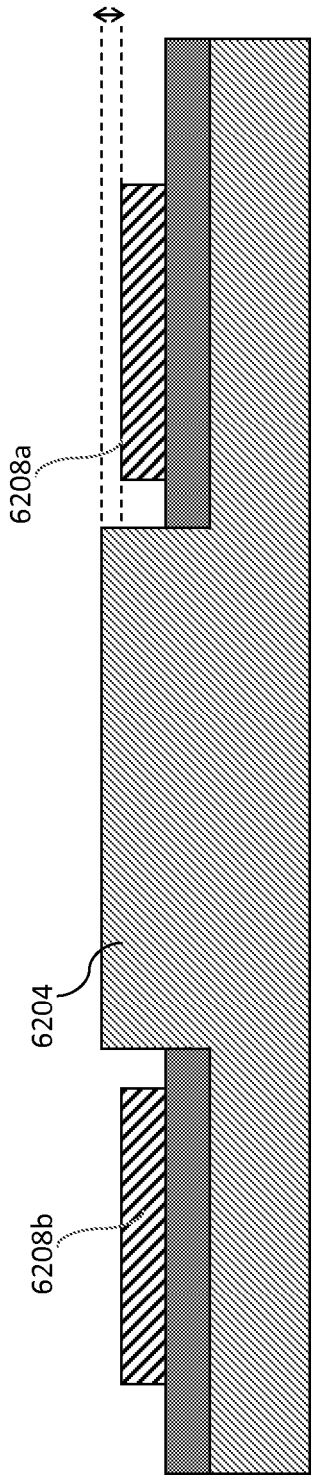
Figure 6B:
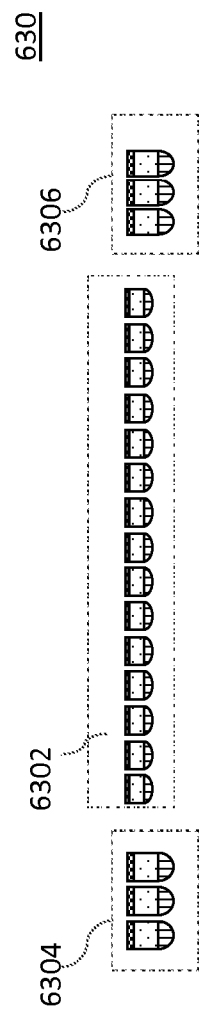
Figure 6C:
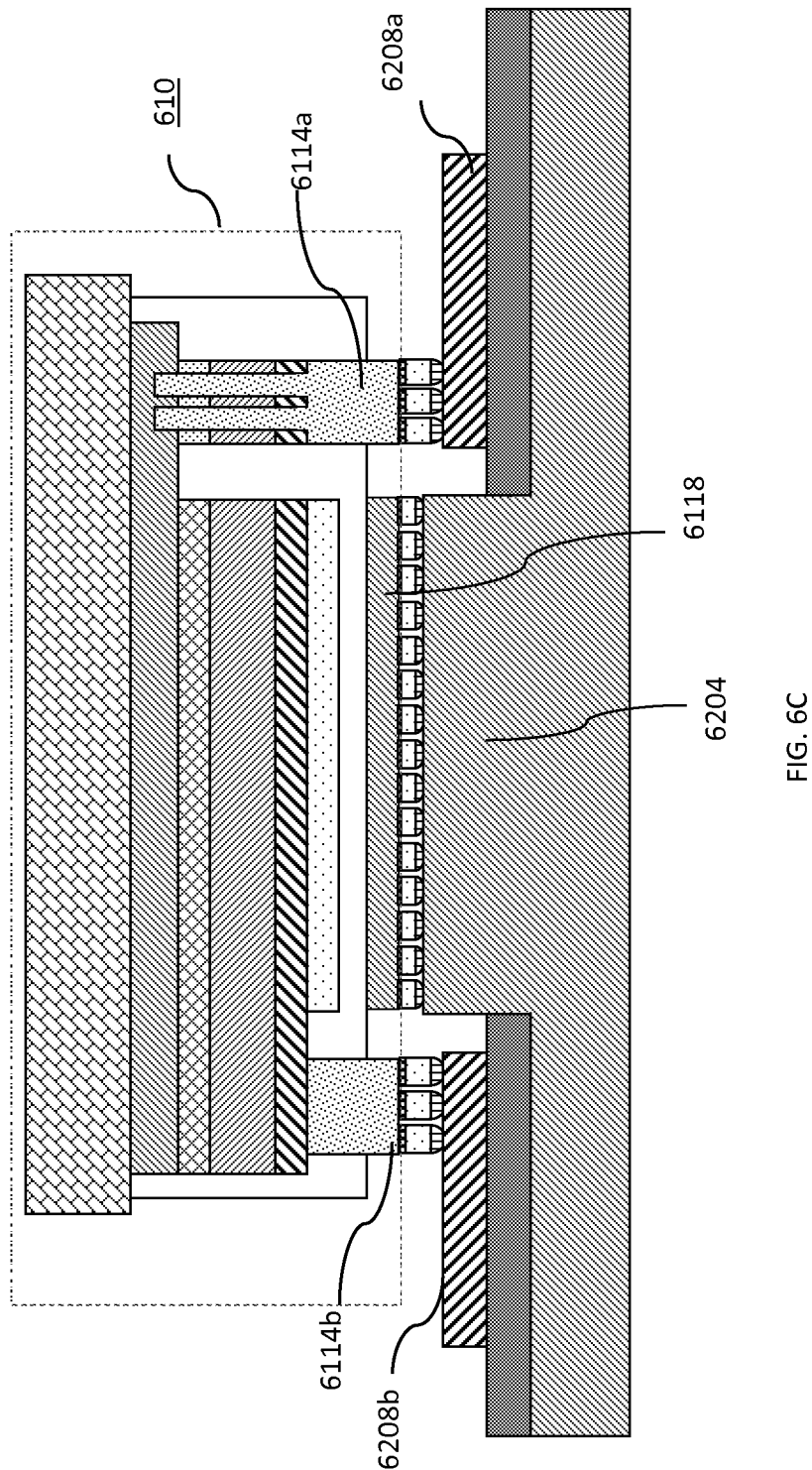

FIGS. 6A-6C illustrate cross-sectional views of a COB LED structure according to example embodiments. As shown in FIG. 6A, surface of thermal projection 6204 of a PCB 620 is higher than surface of a first electrode pad 6208a and surface of a second electrode pad 6208b. In this embodiment, thermal layer 6118 of a LED device 610 may have a surface planar to surface of a first contact pad 6114a and surface of a second contact pad 6114b. To couple the LED device 610 to the PCB 620, dissipation unit array 630 shown in FIG. 6B may be employed. As shown in FIG. 6B, dissipation units in thermal dissipation unit group 6302 may be smaller than dissipation units in electrical dissipation unit groups 6304 and 6306. In this manner, as shown in FIG. 6C, the first contact pad 6114a is electrically coupled to the first electrode pad 6208a. The second contact pad 6114b is electronically coupled to the second electrode pad 6208b. Thermal layer 6118 is thermally coupled to thermal projection 6204.

Figure 7A:
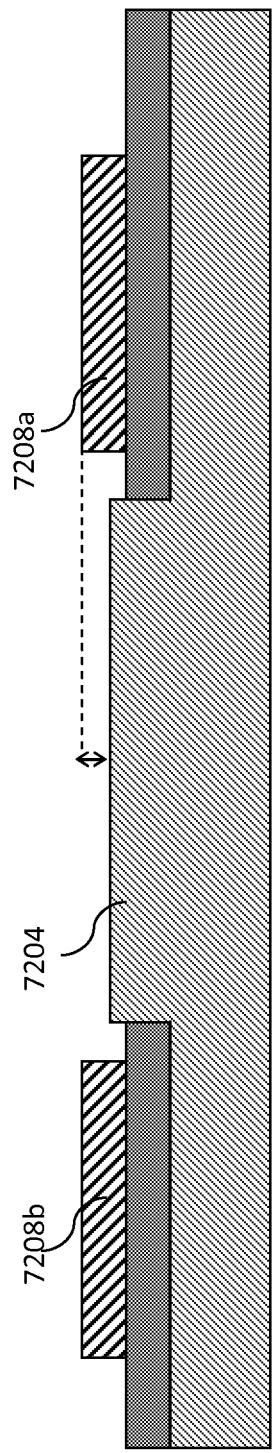
Figure 7B:
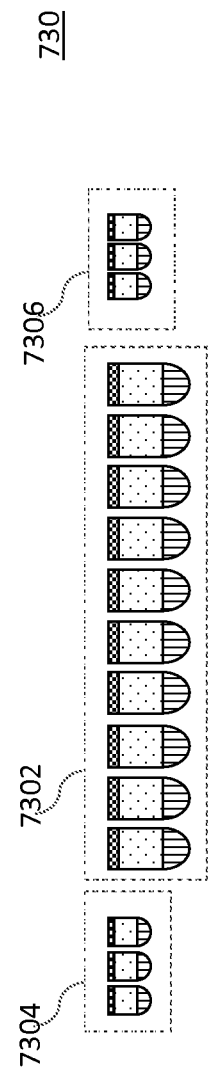
Figure 7C:
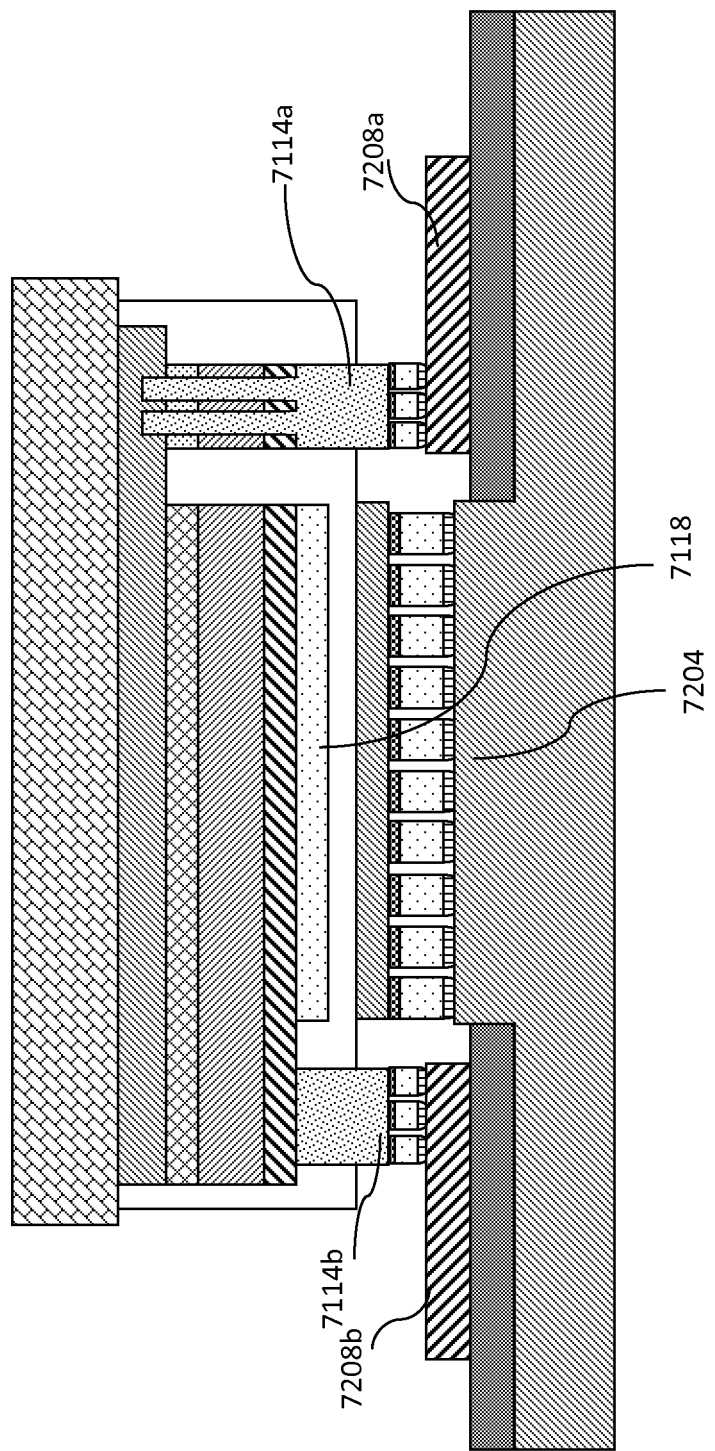

In another embodiment as shown in FIGS. 7A-7C, surface of thermal projection 7204 is lower than surface of a first electrode pad 7208a and surface of a second electrode pad 7208b. Dissipation unit array shown in FIG. 7B may be employed. In this embodiment, size of dissipation units in thermal dissipation unit group 7302 may be larger than dissipation units in electrical dissipation unit group 7304 and 7306. In this manner, first contact pad 7114a is electrically coupled to the first electrode pad 7208a. Second contact pad 7114b is electrically coupled to the second electrode pad 7208b. Thermal layer 7118 is thermally coupled to thermal projection 7204, as shown in FIG. 7C.

Many modifications and other example embodiments set forth herein will come to mind to one skilled in the art to which these example embodiments pertain having the benefit of the teachings presented in the foregoing descriptions and the associated drawings. Therefore, it is to be understood that the embodiments are not to be limited to the specific ones disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions other than those explicitly described above are also contemplated as may be set forth in some of the appended claims. Although specific terms are employed herein, they are used in a generic and descriptive sense only and not for purposes of limitation.

That which is claimed:

1. A chip on board light emitting diode device comprising:
a light emitting diode device comprising:
a light emitting diode substrate;
a light emitting diode conductive layer forming a first contact pad and a second contact pad above the light emitting diode substrate; and
a thermal layer formed on top surface of the light emitting diode substrate, the thermal layer comprising a first thermal conductive material;
a printed circuit board comprising:
a printed circuit board substrate with a thermal projection projecting from surface of the printed circuit board substrate, the thermal projection and the printed circuit board substrate comprising a second thermal conductive material;
a printed circuit board conductive layer forming a first electrode pad and a second electrode pad above the printed circuit board substrate; and
a dissipation unit array comprising a plurality of dissipation units each disposed between the light emitting diode device and the printed circuit board; and
wherein the thermal layer is thermally coupled to the thermal projection via at least one of the plurality of dissipation units; and
wherein the first contact pad is electrically coupled to the first electrode pad via one of the plurality of dissipation units, and the second contact pad is electrically coupled to the second electrode pad.

2. The device of claim 1, wherein each of the dissipation units comprises a dissipation base, a dissipation body on the dissipation base and a dissipation cap covering the dissipation body.

3. The device of claim 2, wherein each of the dissipation units is thermally coupled to the light emitting diode device with the thermal layer in contact with the dissipation base, and wherein each of the dissipation unit is thermally coupled to the printed circuit board with the thermal projection in contact with the dissipation cap.

4. The device of claim 2, wherein each of the dissipation units is electrically coupled to the light emitting diode device with the contact pads in contact with the dissipation base, and wherein each of the dissipation unit is electrically coupled to the printed circuit board with the electrode pads in contact with the dissipation cap.

5. The device of claim 2, wherein the dissipation base comprises at least one of Ti, Al and Ni.

6. The device of claim 2, wherein the dissipation body comprises at least one of Cu and Al.

7. The device of claim 2, wherein the dissipation cap comprises at least one of Ni, Sn, Ag, Pb and Au.

8. The device of claim 1, wherein surface of the first contact pad and surface of the second contact pad are planer to surface of the thermal layer.

9. The device of claim 1, wherein surface of the first contact pad and surface of the second contact pad are higher or lower than surface of the thermal layer.

10. The device of claim 1, wherein surface of the first electrode pad and surface of the second electrode pad are planar to surface of the thermal projection.

11. The device of claim 1, wherein surface of the thermal projection is higher or lower than surface of the first electrode pad and surface of the second electrode pad.

12. The device of claim 1, wherein each dissipation unit has the same size.

13. The device of claim 1, wherein size of the dissipation units in thermal dissipation unit group is different than that of the dissipation units in electrical dissipation unit group.

14. The device of claim 1, wherein the light emitting diode device further comprises a first type semiconductor layer, an active layer formed on the first type semiconductor layer and a second type semiconductor layer formed on the active layer, the first and second type semiconductor layers including a first material, the active layer including a second material, the first material has wider band gap than that of the second material.

15. The device of claim 14, wherein the light emitting diode device further comprises a conductive layer formed on the second type semiconductor layer.

16. The device of claim 15, wherein the light emitting diode device further comprises a reflective layer covering at least a portion of the conductive layer.

17. The device of claim 16, wherein the light emitting diode device further comprises a passivation layer covering underlying layers.

18. The device of claim 1, wherein the printed circuit board further comprises a dielectric layer sandwiched between the printed circuit board substrate and the electrode pads.

19. The device of claim 1, wherein the printed circuit board substrate and the thermal projection comprise at least one of Al, Cu, Ag, Au, metal alloy and graphite.

* * * * *